(12) United States Patent
Nystad et al.

(10) Patent No.: US 10,331,404 B2
(45) Date of Patent: Jun. 25, 2019

(54) NUMBER FORMAT PRE-CONVERSION INSTRUCTIONS

(71) Applicant: ARM Limited, Cambridge (GB)

(72) Inventors: Jorn Nystad, Trondheim (NO); Andreas Due Engh-Halstvedt, Trondheim (NO); Simon Alex Charles, Cambridge (GB)

(73) Assignee: ARM Limited, Cambridge (GB)

( * ) Notice: Subject to any disclaimer, the term of this patent is extended or adjusted under 35 U.S.C. 154(b) by 554 days.

(21) Appl. No.: 14/584,237

(22) Filed: Dec. 29, 2014

(65) Prior Publication Data

US 2015/0120795 A1    Apr. 30, 2015

Related U.S. Application Data

(62) Division of application No. 13/137,950, filed on Sep. 22, 2011, now Pat. No. 8,959,131.

(30) Foreign Application Priority Data

Feb. 22, 2011  (GB) .................................. 1103020.2

(51) Int. Cl.
  *G06F 7/483*    (2006.01)
  *G06F 9/30*    (2018.01)
  (Continued)

(52) U.S. Cl.
  CPC ................ *G06F 5/00* (2013.01); *G06F 7/483* (2013.01); *G06F 7/499* (2013.01);
  (Continued)

(58) Field of Classification Search
  CPC ............................ G06F 9/30025; H03M 7/24
  See application file for complete search history.

(56) References Cited

U.S. PATENT DOCUMENTS 5,303,174 A * 4/1994 Okamoto ................ G06F 7/485
  708/204
5,805,475 A   9/1998 Putrino et al.
  (Continued)

FOREIGN PATENT DOCUMENTS

EP     2 112 591     10/2009

OTHER PUBLICATIONS

UK Search Report dated Jun. 16, 2011 for GB 1103020.2.
(Continued)

*Primary Examiner* — Chuong D Ngo
(74) *Attorney, Agent, or Firm* — Nixon & Vanderhye P.C.

(57) ABSTRACT

Apparatus for processing data includes processing circuitry 16, 18, 20, 22, 24, 26 and decoder circuitry 14 for decoding program instructions. The program instructions decoded include a floating point pre-conversion instruction which performs round-to-nearest ties to even rounding upon the mantissa field of an input floating number to generate an output floating point number with the same mantissa length but with the mantissa rounded to a position corresponding to a shorter mantissa field. The output mantissa field includes a suffix of zero values concatenated the rounded value. The decoder for circuitry 14 is also responsive to an integer pre-conversion instruction to quantise and input integer value using round-to-nearest ties to even rounding to form an output integer operand with a number of significant bits matched to the mantissa size of a floating point number to which the integer is later to be converted using an integer-to-floating point conversion instruction.

15 Claims, 8 Drawing Sheets

(51) Int. Cl.
*H03M 7/24* (2006.01)
*G06F 5/00* (2006.01)
*G06F 7/499* (2006.01)

(52) U.S. Cl.
CPC ...... *G06F 9/30014* (2013.01); *G06F 9/30025* (2013.01); *H03M 7/24* (2013.01); *G06F 7/49963* (2013.01); *G06F 2207/382* (2013.01)

(56) References Cited

U.S. PATENT DOCUMENTS

| | | | |
|---|---|---|---|
| 5,940,311 A | 8/1999 | Dao et al. | |
| 6,249,798 B1 * | 6/2001 | Golliver | H03M 7/24 708/490 |
| 6,282,554 B1 | 8/2001 | Abdallah et al. | |
| 6,327,604 B1 | 12/2001 | Steele, Jr. | |
| 2006/0284747 A1 * | 12/2006 | Moriya | H03M 7/24 341/51 |
| 2007/0139235 A1 | 6/2007 | Moriya et al. | |
| 2009/0172065 A1 | 7/2009 | Cornea-Hasegan | |
| 2010/0095099 A1 | 4/2010 | Boersma et al. | |

OTHER PUBLICATIONS

IBM, "PowerPC™ Microprocessor Family: The Programming Environments for 32-Bit Microprocessors" Feb. 2000, pp. ii, 8-85, 137-141.

S. Boldo et al, "Introduction Rounding to Odd Applications Conclusion—When Double Rounding is Odd" Jul. 2005, 23 pages.

UK Examination Report dated Mar. 8, 2017 in GB 1103020.2, 4 pages.

* cited by examiner

NUMBER FORMAT PRE-CONVERSION INSTRUCTIONS

BACKGROUND

This application is a divisional of U.S. patent application Ser. No. 13/137,950, filed Sep. 22, 2011 (now U.S. Pat. No. 8,959,131), which claims priority of GB Application No. 1103020.2 filed Feb. 22, 2011, the entire contents of each of which are incorporated herein by reference.

This invention relates to the field of data processing systems. More particularly, this invention relates to data processing systems supporting multiple number formats where it is desired to convert numbers between those formats.

It is known to provide data processing systems which support floating point numbers. Such floating point numbers may be represented in accordance with the IEEE 754 Standard. Such floating point numbers include a sign bit, an exponent field and a mantissa field. Different floating point number lengths are supported, such as 16-bit floating point numbers, 32-bit floating point numbers and 64-bit floating point numbers. In some forms of desired processing it is necessary to convert an operand from one floating number point format to a narrower number floating point format. When the mantissa field of a floating point number is reduced in size, it is necessary to perform rounding in relation to the portion of the mantissa field which is being lost. Various rounding modes are known and include round-to-nearest ties to even. An problem that can arise is the rounding is performed in more than one stage, i.e. first rounding to a mantissa of an intermediate length and then rounding to the final shorter mantissa. In this situation it is possible that a different mantissa will result compared to if the mantissa field was subject to one rounding operation and went directly from its initial field length to its final field length. This type of error may be termed a double rounding error.

SUMMARY

Viewed from one aspect present invention provides apparatus for processing data comprising:

processing circuitry configured to perform processing operations including floating point processing operations having $2^N$-bit floating point operands with an X-bit mantissa field and floating point processing operations having $2^{(N-2)}$-bit floating point operands with a Y-bit mantissa field, where N, X and Y are positive integers and X>Y; and decoder circuitry configured to decode program instructions to generate control signals to control said processing circuitry to perform said processing operations; wherein said decoder circuitry is configured to decode a floating point pre-conversion instruction to generate control signals to control said processing circuitry to perform a data processing operation to give a result the same as given by:

receiving a $2^N$-bit input floating point operand having an X-bit input mantissa field;

converting said X-bit input mantissa field to a Y-bit intermediate mantissa field with rounding using a round-to-nearest ties to even rounding mode;

concatenating said Y-bit intermediate mantissa field with a suffix value comprising (X−Y) zeros to form an X-bit output mantissa field; and generating a $2^N$-bit output floating point operand having said X-bit output mantissa field.

The present technique recognises the above problem and provides a solution by adding support for a floating point pre-conversion instruction to the apparatus for data processing with the floating point pre-conversion instruction serving to control the processing circuitry to generate an output floating point operand of the same width as the input floating point operand, but having its output mantissa modified to a value the same as if the input mantissa field had been rounded to the length of the intermediate mantissa field with a suffix of zero values to pad the output mantissa field back to the size required by the output floating point operand. Thus, if the output floating point operand is subsequently subject to rounding operations seeking to reduce the mantissa field down to the size of the intermediate mantissa field, then double rounding errors will be avoided as the output mantissa field has already been rounded down to the intermediate mantissa field size and the subsequent rounding operations will merely discard trailing zero values.

The present techniques find particular utility in embodiments which support a first floating point conversion instruction which converts a $2^N$-bit input floating point operand to a $2^{(N-1)}$-bit output floating point operand as well as a second floating point conversion instruction which converts a $2^{(N-1)}$-bit input floating point operand to a $2^{(N-2)}$-bit output floating point operand. Such embodiments may reduce the width of a floating point operand in two stages leading to the possibility of the double rounding errors. This may be avoided by the use of the floating point pre-conversion instruction.

While not limited to this application, the floating point pre-conversion instruction is of particular use when handling 64-bit floating point operands where the floating point pre-conversion instruction converts the mantissa field such that it is grounded to a 10-bit mantissa field as used in standard 16-bit floating point operands. Thus, if the output floating point operand of the floating point pre-conversion instruction, which is a 64-bit floating point number, is subsequently rounded down to a 16-bit floating point number, then the mantissa field has already been rounded at the correct point and thus will be free of double rounding errors.

In some embodiments the input exponent value from the input floating point operand may be unchanged in forming the output exponent of the output floating point operand. This simplifies the processing which needs to be performed by the floating point pre-conversion instruction and does not raise any difficulty as subsequent floating points conversion instructions can narrow the floating point operand width and handle out-of-range values of the exponent field.

Viewed by another aspect the present invention provides apparatus for processing data comprising:

processing means for performing processing operations including floating point processing operations having $2^N$-bit floating point operands with an X-bit mantissa field and floating point processing operations having $2^{(N-2)}$-bit floating point operands with a Y-bit mantissa field, where N, X and Y are positive integers and X>Y; and decoder means for decoding program instructions to generate control signals to control said processing means to perform said processing operations; wherein said decoder means is configured to decode a floating point pre-conversion instruction to generate control signals to control said processing means to perform a data processing operation to give a result the same as given by:

receiving a $2^N$-bit input floating point operand having an X-bit input mantissa field;

converting said X-bit input mantissa field to a Y-bit intermediate mantissa field with rounding using a round-to-nearest ties to even rounding mode;

concatenating said Y-bit intermediate mantissa field with a suffix value comprising (X−Y) zeros to form an X-bit output mantissa field; and generating a $2^N$-bit output floating point operand having said X-bit output mantissa field.

Viewed from a further aspect the present invention provides a method of processing data comprising the steps of:

performing processing operations including floating point processing operations having $2^N$-bit floating point operands with an X-bit mantissa field and floating point processing operations having $2^{(N-2)}$-bit floating point operands with a Y-bit mantissa field, where N, X and Y are positive integers and X>Y; and decoding program instructions to generate control signals to control said processing operations; wherein said step of decoding includes decoding a floating point pre-conversion instruction to generate control signals to control a data processing operation to give a result the same as given by:

receiving a $2^N$-bit input floating point operand having an X-bit input mantissa field; converting said X-bit input mantissa field to a Y-bit intermediate mantissa field with rounding using a round-to-nearest ties to even rounding mode;

concatenating said Y-bit intermediate mantissa field with a suffix value comprising (X-Y) zeros to form an X-bit output mantissa field; and generating a $2^N$-bit output floating point operand having said X-bit output mantissa field.

A related problem arises when converting an integer operand to a narrower floating point operand. The mantissa field which will represent the integer value may require rounding to fit within the number of bits provided for representing the mantissa field within the floating point operand format. The rounding position within the integer input operand will vary depending upon the magnitude of the input integer.

Viewed from another aspect the present invention provides apparatus for processing data comprising:

processing circuitry configured to perform processing operations including integer processing operations having $2^N$-bit integer operands and floating point processing operations having $2^M$-bit floating point operands with a Y-bit mantissa field, where N, M and Y are positive integers and N>M; and decoder circuitry configured to decode program instructions to generate control signals to control said processing circuitry to perform said processing operations; wherein said decoder circuitry is configured to decode an integer pre-conversion instruction to generate control signals to control said processing circuitry to perform a data processing operation to give a result the same as given by:

receiving a $2^N$-bit input integer operand; and quantizing said $2^N$-bit input integer operand using a round-to-nearest ties to even rounding mode to form an $2^N$-bit output integer operand with (Y+1) significant bits.

The provision of an integer pre-conversion instruction which generates an output integer operand of the same bit size as the input integer operand and having been quantised using a round-to-nearest ties to even rounding mode to a value with a number of significant bits which can be represented by the mantissa field within the eventual target floating point operand to which the integer operand is to be converted by a subsequent instruction. Provision of this integer pre-conversion instruction enables integer-to-floating point conversions to be more readily accommodated within the processing paths of the apparatus.

The integer pre-conversion instruction is well suited to use within embodiments which support integer-to-floating point conversion instructions that reduce the size of the operand by either a factor of two or a factor of four, e.g. 64-bit integer to 32-bit floating point or 64-bit integer to 16-bit floating point. The input integers may be 64-bit integers or 32-bit integers and the output floating point numbers may be 32-bit floating point numbers or 16-bit floating point numbers.

Viewed from another aspect the present invention provides apparatus for processing data comprising:

processing means for performing processing operations including integer processing operations having $2^N$-bit integer operands and floating point processing operations having $2^M$-bit floating point operands with a Y-bit mantissa field, where N, M and Y are positive integers and N>M; and decoder means for decoding program instructions to generate control signals to control said processing means to perform said processing operations; wherein said decoder means is configured to decode an integer pre-conversion instruction to generate control signals to control said processing means to perform a data processing operation to give a result the same as given by:

receiving a $2^N$-bit input integer operand; and quantizing said $2^N$-bit input integer operand using a round-to-nearest ties to even rounding mode to form an $2^N$-bit output integer operand with (Y+1) significant bits.

Viewed from a further aspect the present invention provides a method of processing data comprising the steps of:

performing processing operations including integer processing operations having $2^N$-bit integer operands and floating point processing operations having $2^M$-bit floating point operands with a Y-bit mantissa field, where N, M and Y are positive integers and N>M; and decoding program instructions to generate control signals to control said processing operations; wherein said steps of decoding decoding an integer pre-conversion instruction to generate control signals to control a data processing operation to give a result the same as given by:

receiving a $2^N$-bit input integer operand; and quantizing said $2^N$-bit input integer operand using a round-to-nearest ties to even rounding mode to form an $2^N$-bit output integer operand with (Y+1) significant bits.

The above, and other objects, features and advantages of this invention will be apparent from the following detailed description of illustrative embodiments which is to be read in connection with the accompanying drawings.

DESCRIPTION OF EXAMPLE EMBODIMENTS

Figure 1:
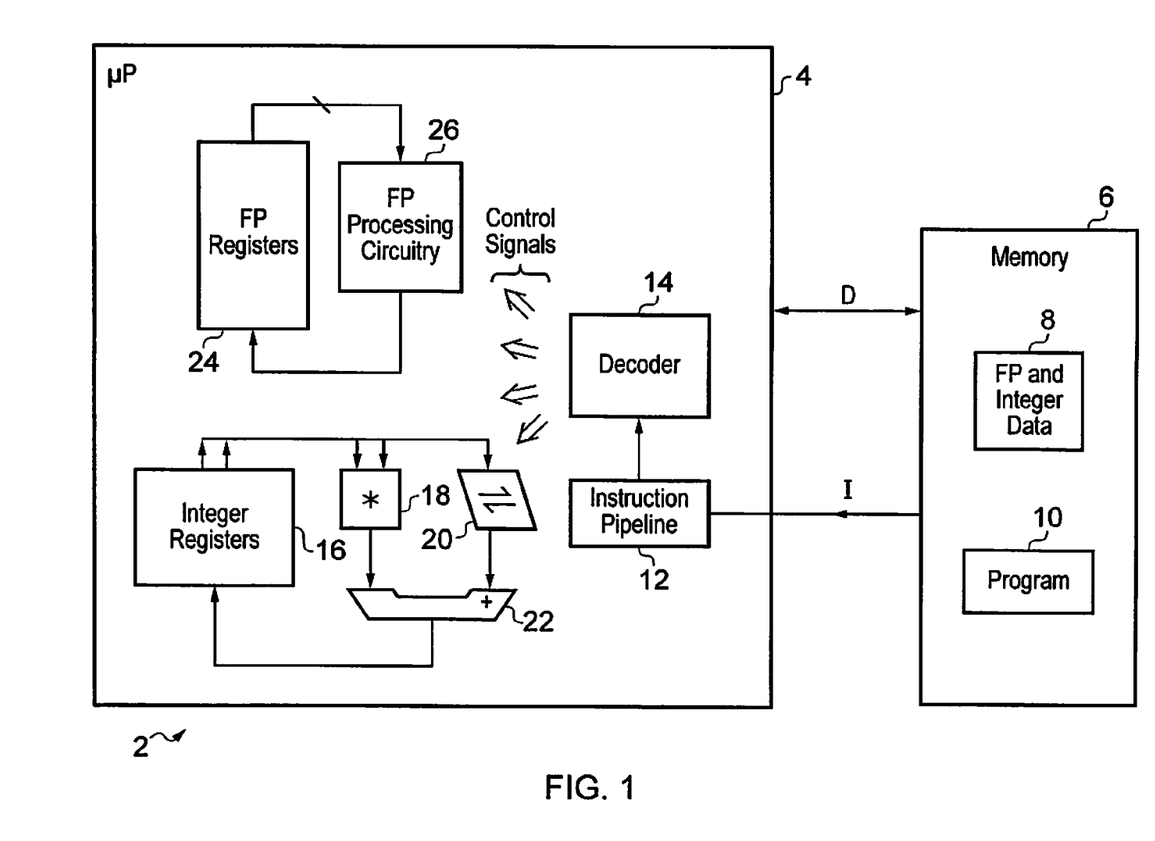
FIG. 1 schematically illustrates an apparatus for processing data.

FIG. 1 schematically illustrates a data processing apparatus to comprising a processor core 4 coupled to a memory 6. The memory 6 stores floating point and integer data 8 for manipulation under control of program instructions 10. The processor core 4 fetches program instructions from memory 6 in to an instruction pipeline 12. The decoder circuitry 14 reads the program instructions from one stage of an instruction pipeline 14 and generates control signals for controlling processing operations to be performed by processing circuitry within the processor core. The processing circuitry may include a data path formed of integer registers 16, a multiplier 18, a shifter 20 and an adder 22. The processing circuitry may also include floating point registers 24 and floating point processing circuitry 26. The control signals generated by the decoder circuitry 14 in response to the program instructions are used to configure and control the processing circuitry 16, 18, 20, 22, 24, 26 to perform the desired processing operations. This type of configuration of a processor core 4 will be familiar to those in this technical field and it will be appreciated that elements of the processor core 4 are not illustrated for the sake of simplicity.

It will be further understood that while the example of FIG. 1 shows separate integer and floating point data paths, it is possible to use the present techniques within a system which incorporates a unified data path which performs both floating point processing operations and integer processing operations. Furthermore, the present technique may also be used within embodiments supporting superscaler and multicore techniques. In some embodiments, for example, the floating point pre-conversion instructions and the integer pre-conversion instructions of the present techniques may be implemented by the circuits of a vector addition unit within the processing pipeline of a graphics processing unit. However, the present techniques are not limited to this field of application.

Figure 2:
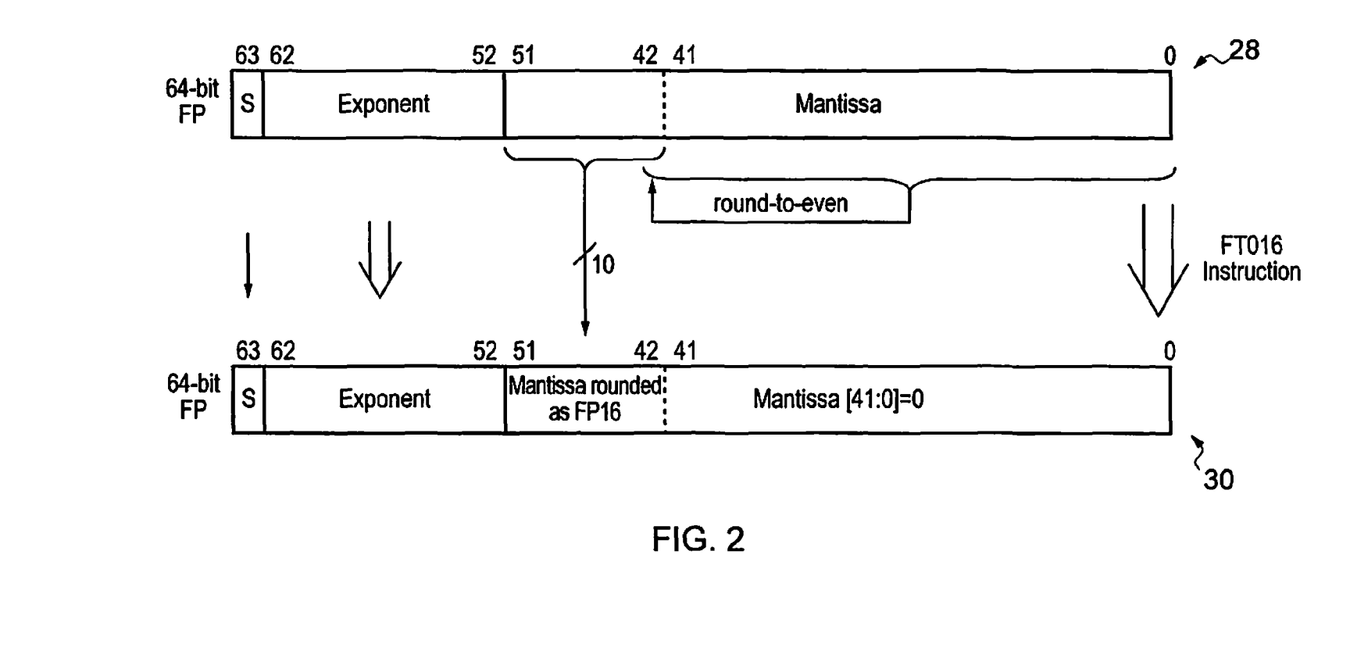
FIG. 2 schematically illustrates the operation of a floating point pre-conversion instruction.

FIG. 2 schematically illustrates the operation of a floating point pre-conversion instruction (FTO16). The input floating point operand 28 is a 64-bit floating point number including a 1-bit sign, an 11-bit exponent field and a 52-bit mantissa field. The action of the floating point pre-conversion instruction leaves the sign bit S and the exponent field unaltered.

The input mantissa field has a bit length of 52. This is rounded to an intermediate mantissa field having a bit length of 10 and occupying bit positions 51 to 42 in the output floating point operand 30. This intermediate mantissa field is been subject to round-to-nearest ties to even rounding in respect of the least significant 42 bits of the input mantissa field. This rounding feeds into the least significant bit of the intermediate mantissa field and can carry through into the more significant bits in the normal way.

A suffix value comprising 42 "0's" is concatenated with the intermediate mantissa field at its least significant end to form an output mantissa field which still contains 52 bits in accordance with the floating point number format of the output floating point operand 30.

However, the mantissa field of the output floating point operand 30 has already been rounded down to an effective 10-bit length in preparation for use within a 16-bit floating point number. If the output mantissa field of the output floating point number 30 is subject to multiple subsequent rounding operations, while providing the 16-bit float point number then these will merely discard the trailing zero values and will not alter the intermediate mantissa field within bit positions [51:42].

Figure 3:
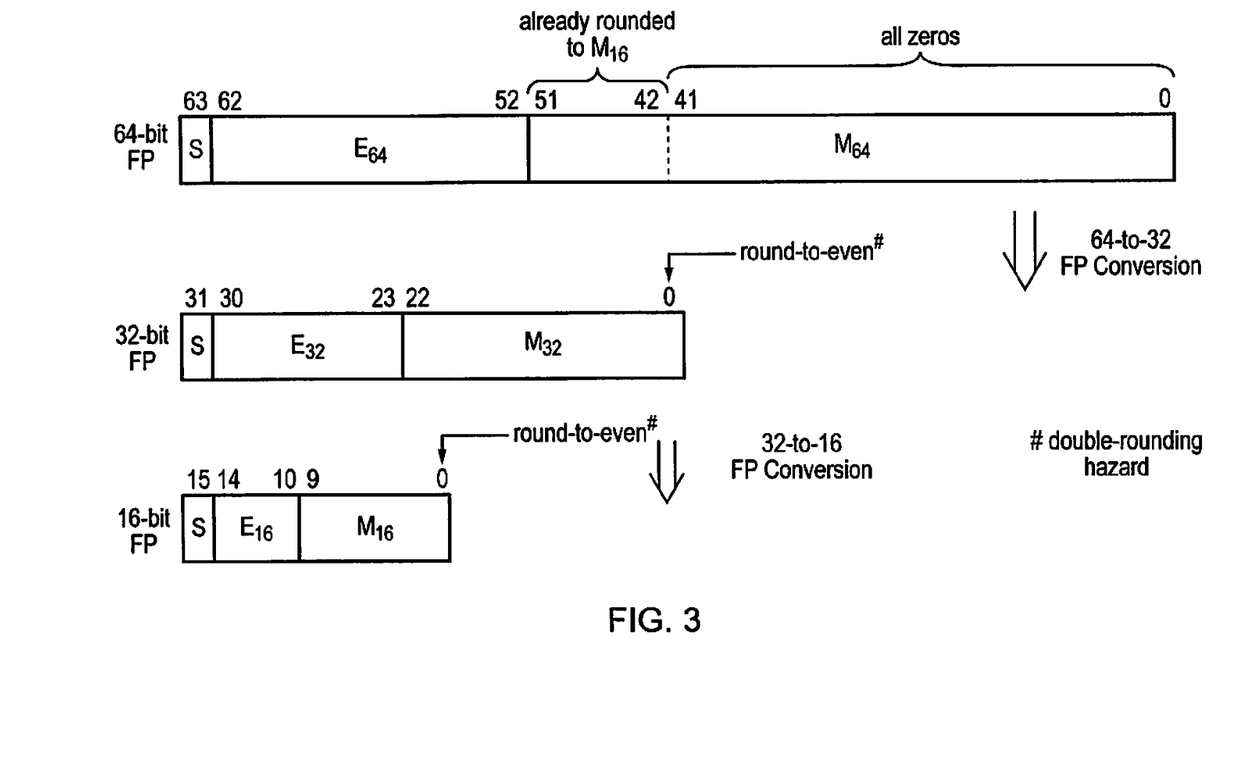
FIG. 3 schematically illustrates a two-stage bit width conversion of a floating point number.

FIG. 3 schematically illustrates the operation of a two-stage floating point conversion. The starting point is a 64-bit floating point number including a 52-bit mantissa. This is first converted with a 64-to-32 floating point conversion instruction in to a 32-bit floating point number. There is a first round-to-nearest ties to even rounding applied in this operation which feeds in to the least significant bit of the output mantissa.

A second floating point conversion instruction is then performed to change the data width from 32 to 16 bits. The final 16-bit floating point number has a 10-bit mantissa field. A second round-to-nearest ties to even rounding is performed when converting from the 23-bit mantissa of the 32-bit floating point number down to the 10-bit mantissa of the 16-bit floating point number. The two rounding operations illustrated in FIG. 3 can give rise to a double rounding hazard producing a different mantissa result than if the 52-bit original input mantissa field had been directly rounded down to the final 10-bit output mantissa field. This problem is addressed by first executing the pre-conversion instruction of FIG. 2 with the input 64-bit floating point number as the input operand such that the mantissa field is prepared in advance and rounded down to an effective 10-bit mantissa field with a suffix of all zero values.

It will be appreciated that the operations illustrated above and elsewhere in this description in relation to particular instructions may be performed using different steps and/or with a different ordering of steps. Such different steps and/or orderings may nevertheless produce a result with the same value as given by the steps described herein. Such alternatives are encompassed within the scope of the present techniques.

Figure 4:
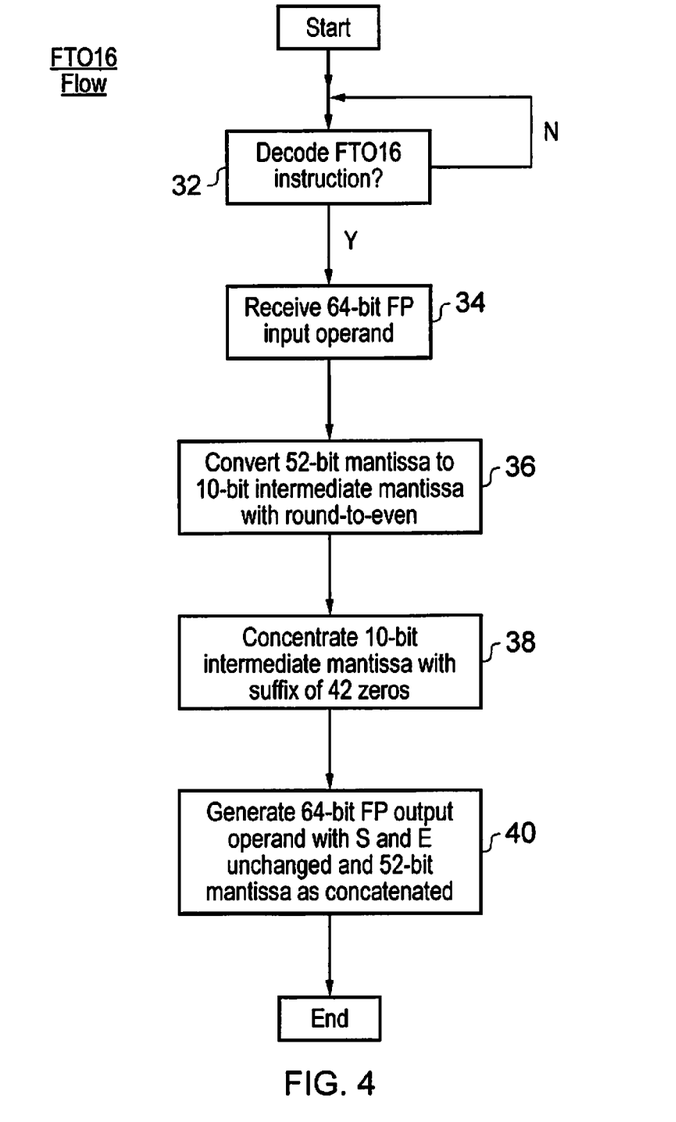
FIG. 4 is a flow diagram schematically illustrating the operation of a floating point pre-conversion instruction.

FIG. 4 is a flow diagram schematically illustrating the operation of a floating point pre-conversion instruction. At step 32 a floating point pre-conversion instruction is received by the decoder circuitry 14 for decoding. The decoder circuitry 14 generates control signals to control the processing circuitry to perform the subsequent steps illustrated in FIG. 4. It will be appreciated that while these steps are shown as being performed as a serial sequence in practice these may be performed in a different order or partially or wholly in parallel.

At step 34 the 64-bit floating point input operand is received. At step 36 the 52-bit mantissa of the input operand is converted in to a 10-bit intermediate mantissa using round-to-nearest ties to even rounding in respect of the discarded bits of the mantissa. At step 38 the 10-bit intermediate mantissa is concatenated with a suffix of 42 zero values to generate a 52-bit output mantissa field of the correct size for a 64-bit floating point number. At step 40 the 64-bit floating point operand is formed using the sign bit and the exponent field of the original 64-bit floating point input operand together with the 52-bit mantissa as formed at step 48. This output floating point operand is the result operand for the floating point pre-conversion instruction.

If the 16-bit floating point number will be a denormal floating point number (as detected from the value of the input exponent field), then the rounding point in the mantissa of the input 64-bit floating point number is left shifted to take account of the extra bits of the mantissa that will be discarded when the denormal 16-bit floating point number is generated.

Figure 5:
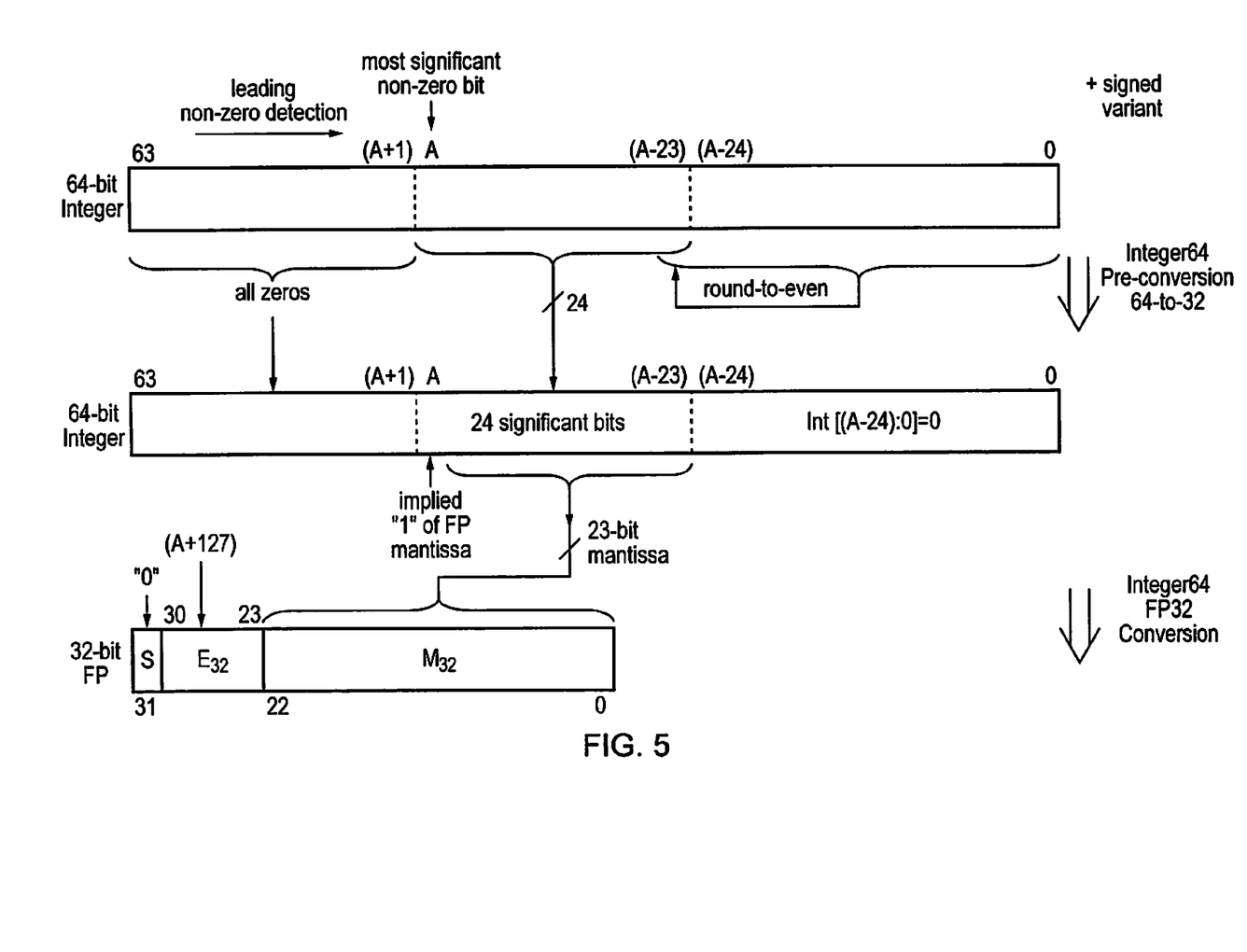
FIG. 5 schematically illustrates the operation of an integer pre-conversion 64-to-32 instruction followed by an integer 64-bit to floating point 32-bit instruction.

FIG. 5 schematically illustrates the action of an integer pre-conversion instruction followed by an integer-to-floating point conversion instruction for converting a 64-bit integer to a 32-bit floating point number. The action of the integer pre-conversion instruction where the target floating point number is a 32-bit number (i.e. a 23 bit mantissa field) is to first perform a leading non-zero value detection operation which determines the bit position of the first non-zero bit starting from the most significant bit end of the 64 bit integer. In this example, the most significant non-zero bit is at bit position A.

The target mantissa field is a 23-bit mantissa field. However, as is known in this technical field, the floating point format assumes a leading bit value of "1" to the left of the decimal point of the mantissa and accordingly this leading "1" maps to the bit at bit position A. The bit which form the mantissa field extend from bit position (A−1) to bit position (A−23).

The bits which are less significant than the bits which will form the mantissa field extend from bit position (A−24) down to bit position 0. These least significant bits form the input together with the least significant bit of the potential mantissa field (bit position (A−23)) to a round-to-nearest ties to even operation which produces a rounding bit which is summed in to bit position (A−23). This rounding bit may ripple up through the remainder of the bits which will form the mantissa field as is known in this technical field.

The output of the integer pre-conversion instruction is also a 64-bit integer, but in this case the integer value has been quantised using a round-to-nearest ties to even rounding mode such that is has a number of significant bits equal to the mantissa field bit width for the target floating point number plus one (to account for the implied leading "1" in the mantissa field). The bits of the output integer in the range (A−24) to 0 may be all set to a value of zero.

When the 64-bit integer to 32-bit floating point conversion is performed, the mantissa field is formed from the least significant 23 bits of the significant bits within the integer pre-conversion instruction result, i.e. dropping the implied "1". The integer-2-floating point version instruction sets the exponent to a value equal to (A+127) to account for the known exponent offset used within 32-bit floating point number according to the IEEE 754 Standard. The sign bit in this example is set to zero.

It is possible that the integer pre-conversion instruction may also be performed in a manner which will deal with 2's complement signed integers. In this case, the integer pre-conversion instruction may first perform a 2's complement negation (invert and add one) before performing the leading non-zero bit detection step, performing the quantisation and then performing another 2's complement negation to restore the sign. Such modifications to encompass integer pre-conversion instructions operating upon signed values are encompassed within the present techniques.

Figure 6:
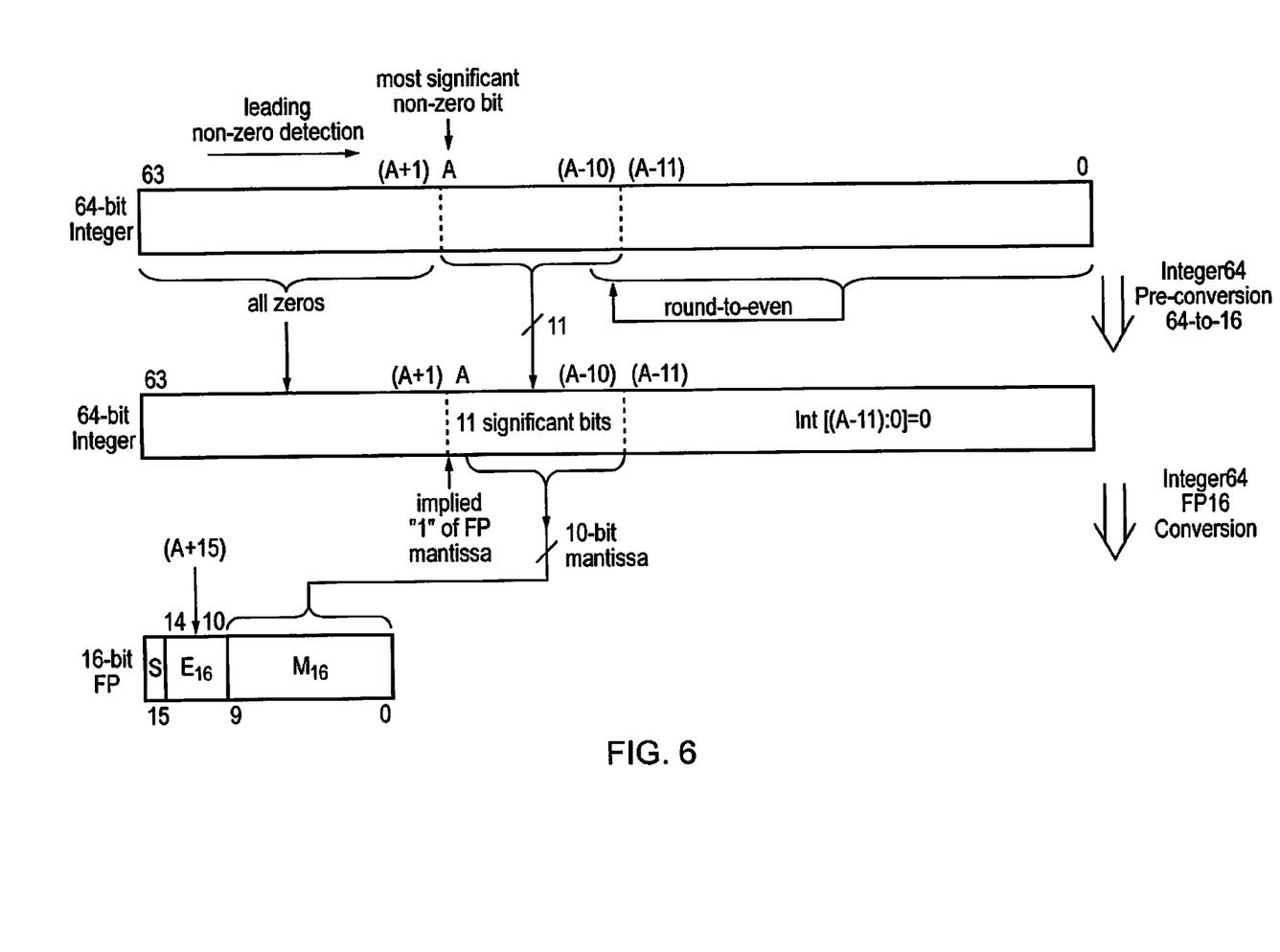
FIG. 6 schematically illustrates the operation of an integer pre-conversion 64-to-16 instruction followed by an integer 64-bit to floating point 16-bit instruction.

FIG. 6 schematically illustrates an integer pre-conversion instruction which in this case is targeting subsequent conversion to a 16-bit floating point number. The difference in the action of this integer pre-conversion instruction is that the quantisation is performed to a value having 11 significant bits. This is a result of the target 16-bit floating point number format using a mantissa field of 10 bits corresponding to a mantissa of 11 bits when the implied leading "1" is included. As before, a leading non-zero value detection step identifies the most significant non-zero bit within the input integer value. The input integer value is then quantised such that it has 11 significant bits starting from this most significant non-zero bit value position. The trailing bits within the bit positions of a lower significance are all set to a value of zero. Thus, the output integer value remains a 64-bit integer but in this case quantised so as to have 11 significant bits with the remaining bits being set to a value of zero.

When an integer-to-floating point conversion instruction is executed to convert the input 64-bit to a 16-bit floating point value, then the 10-bit mantissa field is selected from the least significant bits of the 11 significant bits within the output of the integer pre-conversion instruction. The exponent value is set to (A+15) to account for the normal exponent offset.

Figure 7:
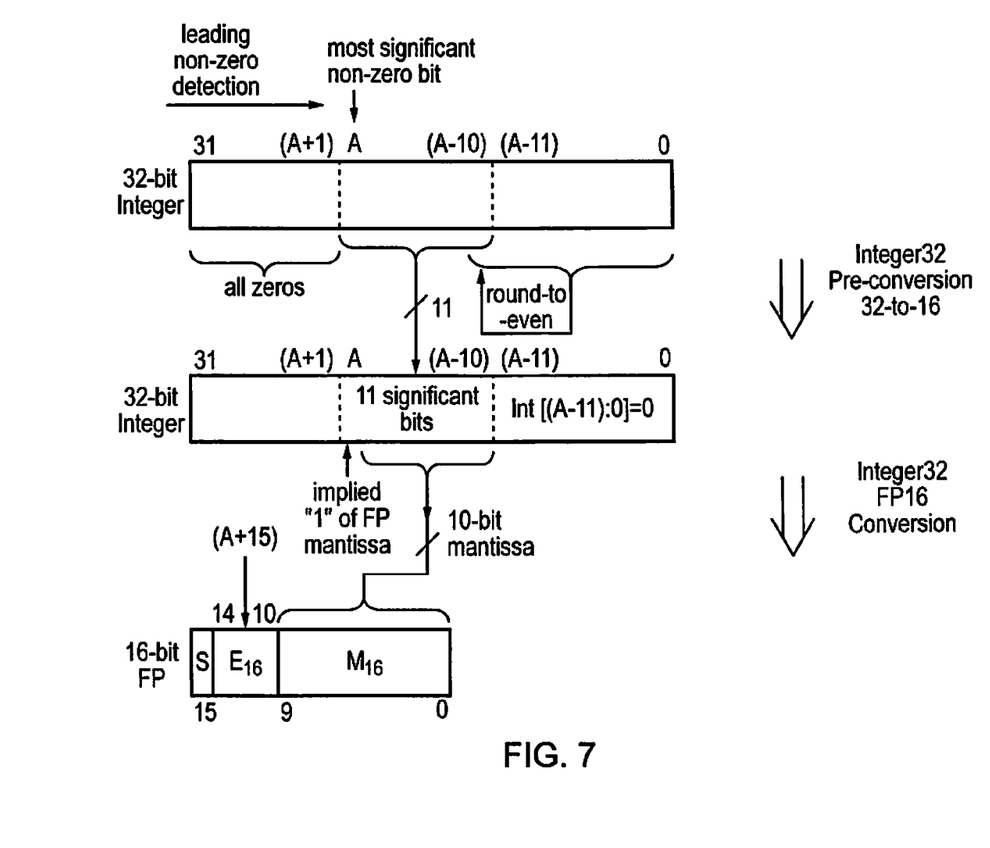
FIG. 7 schematically illustrates the operation of an integer pre-conversion 32-to-16 instruction followed by an integer 32-bit to floating point 16-bit instruction.

FIG. 7 illustrates a further variation of the integer pre-conversion instruction. In this case the integer pre-conversion instruction has a 32-bit integer input operand and is targeting a 16-bit floating point output when subsequent integer-to-floating point conversion is performed. Leading non-zero value detection is performed followed by quantisation to 11 significant bits. The remaining bits of lower significance within the 32-bit integer are all set to a value of zero. The mantissa field for use in the 16-bit floating point number when an integer-to-floating point conversion instruction is executed is taken from the least significant 10 bits of the 11 significant bits to which the integer was quantised. The exponent value is again set to (A+15).

Figure 8:
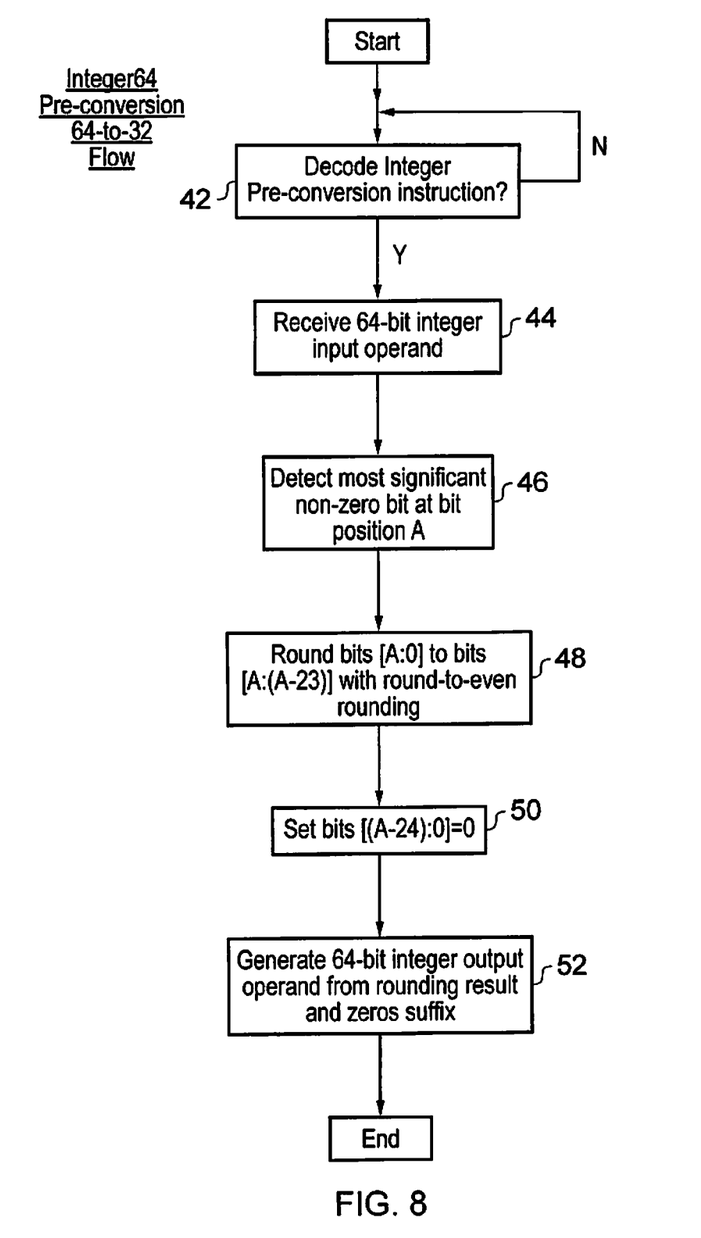
FIG. 8 is a flow diagram schematically illustrating the operation of integer pre-conversion instruction.

FIG. 8 is a flow diagram schematically illustrating the processing of an integer pre-conversion instruction. At step 42 the decoder circuitry 14 waits until an integer pre-conversion instruction is received. At step 44 the 64-bit integer input operand is received. Step 46 detects the most significant non-zero bit at bit position "A" within the 64-bit integer input operand. Step 48 rounds bits [A:0] to form bits [A:(A−23)] with round-to-nearest ties to even rounding. Step 50 then sets [(A−24):0] all to a value of zero. Steps 48 and 50 in conjunction quantising the input integer operand using round-to-nearest ties to even rounding to form an output integer operand with 24 significant bits. It will be appreciated that the number of significant bits to which the quantisation is performed may be varied depending upon the form of the integer pre-conversion instruction decoded at step 42 and matched to the eventual integer-to-floating point conversion to be performed.

At step 52 the output 64-bit integer operand is generated from the rounding result of step 48 together with a suffix of all zero values as generated at step 50.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data comprising:
processing circuitry configured to perform processing operations including integer processing operations having $2^N$-bit integer operands and floating point processing operations having $2^M$-bit floating point operands with a Y-bit mantissa field, where N, M and Y are positive integers and N>M; and
decoder circuitry configured to decode program instructions to generate control signals to control said processing circuitry to perform said processing operations; wherein
said decoder circuitry is configured to decode an integer pre-conversion instruction to generate control signals to control said processing circuitry to perform a data processing operation comprising:

receiving a $2^N$-bit input integer operand;

detecting a bit position of a most significant non-zero bit within the $2^N$-bit input integer operand; and quantizing said $2^N$-bit input integer operand using a round-to-nearest ties to even rounding mode to form a $2^N$-bit output integer operand comprising:
- (Y+1) significant bits starting from the detected bit position, and
- trailing bits trailing the (Y+1) significant bits set to zero.

2. Apparatus as claimed in claim 1, wherein said decoding circuitry is configured to decode a first integer-to-floating point conversion instruction to generate control signals to control said processing circuitry to perform a data processing operation comprising:

converting a $2^N$-bit input integer operand to a corresponding value expressed as a $2^{(N-1)}$-bit output floating point operand.

3. Apparatus as claimed in claim 2, wherein N=6, M=5 and Y=23.

4. Apparatus as claimed in claim 2, wherein N=5, M=4 and Y=10.

5. Apparatus as claimed in claim 1, wherein said decoding circuitry is configured to decode a second integer-to-floating point conversion instruction to generate control signals to control said processing circuitry to perform a data processing operation comprising:

converting a $2^N$-bit input integer operand to a corresponding value expressed as $2^{(N-2)}$-bit output floating point operand.

6. A computer program product storing in a non-transitory form a computer program for controlling a computer to provide virtual machine execution environment for program instructions corresponding to an apparatus as claimed in claim 1.

7. Apparatus as claimed in claim 5, wherein N=6, M=4 and Y=10.

8. Apparatus for processing data comprising:

processing means for performing processing operations including integer processing operations having $2^N$-bit integer operands and floating point processing operations having $2^M$-bit floating point operands with a Y-bit mantissa field, where N, M and Y are positive integers and N>M; and decoder means for decoding program instructions to generate control signals to control said processing means to perform said processing operations; wherein said decoder means is configured to decode an integer pre-conversion instruction to generate control signals to control said processing means to perform a data processing operation comprising:

receiving a $2^N$-bit input integer operand;

detecting a bit position of a most significant non-zero bit within the $2^N$-bit input integer operand; and quantizing said $2^N$-bit input integer operand using a round-to-nearest ties to even rounding mode to form a $2^N$-bit output integer operand comprising:
- (Y+1) significant bits starting from the detected bit position, and
- trailing bits trailing the (Y+1) significant bits set to zero.

9. A method of processing data comprising the steps of:

performing processing operations including integer processing operations having $2^N$-bit integer operands and floating point processing operations having $2^M$-bit floating point operands with a target Y-bit mantissa field, where N, M and Y are positive integers and N>M; and decoding program instructions to generate control signals to control said processing operations; wherein said steps of decoding decoding an integer pre-conversion instruction to generate control signals to control a data processing operation comprising:

receiving a $2^N$-bit input integer operand;

detecting a bit position of a most significant non-zero bit within the $2^N$-bit input integer operand; and quantizing said $2^N$-bit input integer operand using a round-to-nearest ties to even rounding mode to form a $2^N$-bit output integer operand comprising:
- (Y+1) significant bits starting from the detected bit position, and
- trailing bits trailing the (Y+1) significant bits set to zero.

10. A method as claimed in claim 9, wherein said step of decoding decodes a first integer-to-floating point conversion instruction to generate control signals to control a data processing operation comprising:

converting a $2^N$-bit input integer operand to a corresponding value expressed as a $2^{(N-1)}$-bit output floating point operand.

11. A method as claimed in claim 10, wherein N=6, M=5 and Y=23.

12. A method as claimed in claim 10, wherein N=5, M=4 and Y=10.

13. A method as claimed in claim 9, wherein said step of decoding decodes a second integer-to-floating point conversion instruction to generate control signals to control a data processing operation comprising:

converting a $2^N$-bit input integer operand to a corresponding value expressed as a $2^{(N-2)}$-bit output floating point operand.

14. A method as claimed in claim 13, wherein N=6, M=4 and Y=10.

15. A computer program product storing in a non-transitory form a computer program for controlling a computer, said computer program including an integer pre-conversion instruction for controlling said computer to operate in accordance with the method of claim 9.

* * * * *